(12) United States Patent
Shimizu

(10) Patent No.: US 9,590,170 B2
(45) Date of Patent: Mar. 7, 2017

(54) METHOD OF FABRICATING ACOUSTIC WAVE DEVICE

(71) Applicant: TAIYO YUDEN CO., LTD., Tokyo (JP)

(72) Inventor: Yohei Shimizu, Kanagawa (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 514 days.

(21) Appl. No.: 13/942,951

(22) Filed: Jul. 16, 2013

(65) Prior Publication Data

US 2014/0020822 A1 Jan. 23, 2014

(30) Foreign Application Priority Data

Jul. 19, 2012 (JP) .................................. 2012-160358

(51) Int. Cl.
*H01L 41/313* (2013.01)
*H01L 41/338* (2013.01)
*H03H 3/08* (2006.01)

(52) U.S. Cl.
CPC .......... *H01L 41/313* (2013.01); *H01L 41/338* (2013.01); *H03H 3/08* (2013.01); *Y10T 156/1052* (2015.01)

(58) Field of Classification Search
CPC ....... H01L 41/313; H01L 41/338; H03H 3/08; Y10T 156/1052
See application file for complete search history.

(56) References Cited

U.S. PATENT DOCUMENTS

2004/0222717 A1 11/2004 Matsuda et al.

FOREIGN PATENT DOCUMENTS

| JP | 2004-336503 A | 11/2004 |
| JP | 2007-281598 A | 10/2007 |
| JP | 2010-212832 A | 9/2010 |
| JP | 2012-109358 A | 6/2012 |

OTHER PUBLICATIONS

Japanese Office Action dated Nov. 24, 2015, in a counterpart Japanese patent application No. 2012-160358.

*Primary Examiner* — Mark A Osele
*Assistant Examiner* — Christopher C Caillouet
(74) *Attorney, Agent, or Firm* — Chen Yoshimura LLP

(57) ABSTRACT

A method of fabricating an acoustic wave device includes: bonding a support substrate to a piezoelectric substrate on which an IDT is to be formed; forming a modified region in the support substrate by irradiation of a laser beam; and cutting the support substrate and the piezoelectric substrate in the modified region, wherein a distance from a boundary face between the support substrate and the piezoelectric substrate to an edge portion of the modified region at the boundary face side is greater than or equal to 20 μm and less than 69 μm.

2 Claims, 7 Drawing Sheets

METHOD OF FABRICATING ACOUSTIC WAVE DEVICE

CROSS-REFERENCE TO RELATED APPLICATION

This application is based upon and claims the benefit of priority of the prior Japanese Patent Application No. 2012-160358, filed on Jul. 19, 2012, the entire contents of which are incorporated herein by reference.

Field

A certain aspect of the present invention relates to a method of fabricating an acoustic wave device.

Background

Acoustic wave devices such as surface acoustic wave (SAW) devices include a piezoelectric substrate and an IDT (Interdigital Transducer: comb-shaped electrode) located on the upper surface of the piezoelectric substrate. Japanese Patent Application Publication No. 2010-212832 discloses a technique that forms a modified region in the piezoelectric substrate by irradiation of a laser beam and then separates the piezoelectric substrate into individual chips or devices. A cutting process may be performed along a scribe formed by a laser beam.

The piezoelectric substrate may be bonded to a separate substrate. However, the cutting process causes oblique break and chipping of the piezoelectric substrate.

SUMMARY OF THE INVENTION

According to an aspect of the present invention, there is provided a method of fabricating an acoustic wave device, the method including: bonding a support substrate to a piezoelectric substrate on which an IDT is to be formed; forming a modified region in the support substrate by irradiation of a laser beam; and cutting the support substrate and the piezoelectric substrate in the modified region, wherein a distance from a boundary face between the support substrate and the piezoelectric substrate to an edge portion of the modified region at the boundary face side is greater than or equal to 20 μm and less than 69 μm.

DETAILED DESCRIPTION

Figure 1A:
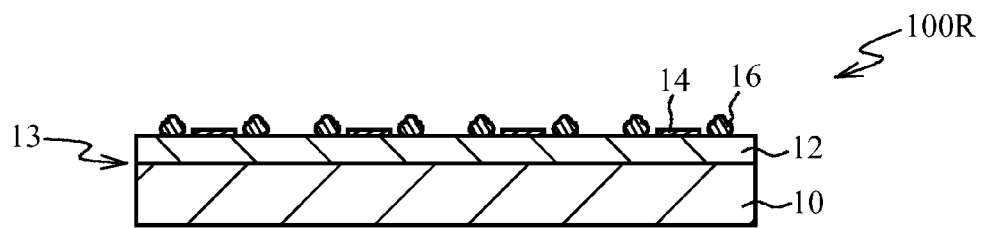
FIG. 1A through FIG. 1C are cross-sectional views illustrating a method of fabricating a SAW device in accordance with a comparative example.
Figure 1B:
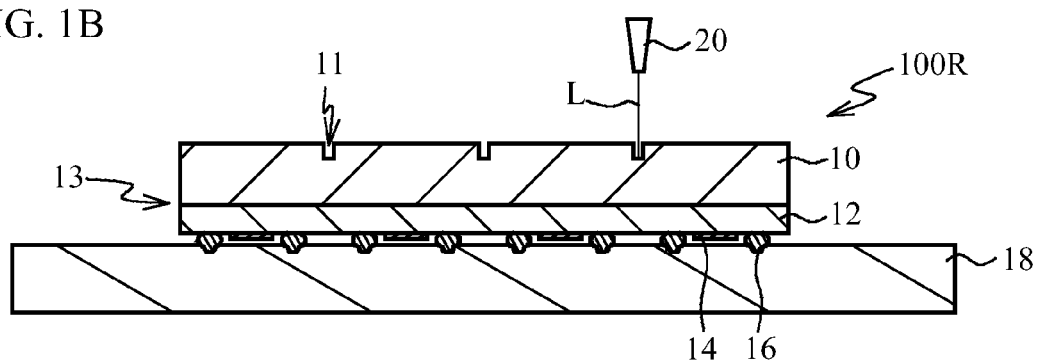
Figure 1C:
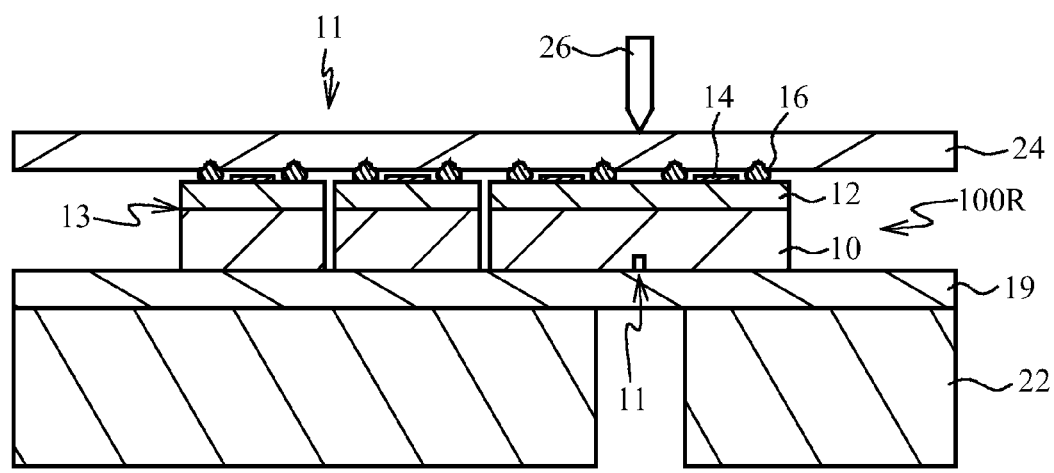

A description will first be given of a comparative example. FIG. 1A through FIG. 1C are cross-sectional views illustrating a method of fabricating a SAW device 100R in accordance with a comparative example.

As illustrated in FIG. 1A, a piezoelectric substrate 12 is bonded to the upper surface of a support substrate 10 in a wafer state. IDTs 14 and terminals 16 are formed on the upper surface of the piezoelectric substrate 12. The SAW device 100R to be separated is formed. The support substrate 10 is formed of an insulating material such as sapphire. The piezoelectric substrate 12 is formed of a piezoelectric substance such as lithium tantalate ($LiTaO_3$) for example. The IDT 14 is formed of a metal such as aluminum (Al) for example. The terminal 16 is formed by stacking Al and gold (Au) from the bottom side. The IDT 14 is electrically coupled to the terminal 16.

As illustrated in FIG. 1B, the SAW device 100R is turned upside down. A dicing tape 18 is attached to the upper surface (surface on which the IDTs 14 and terminals 16 are formed) of the piezoelectric substrate 12. Scribes 11 are formed on the support substrate 10 by irradiating the bottom surface of the support substrate 10 with a laser beam L using a laser irradiation device 20. The scribe 11 is a slit formed from the bottom surface toward the upper surface. The scribe 11 does not reach a boundary face 13 between the support substrate 10 and the piezoelectric substrate 12.

As illustrated in FIG. 1C, a dicing tape 19 is attached to the bottom surface of the support substrate 10. The support substrate 10 is fixed to a supporting stage 22 through the dicing tape 19. A protective sheet 24 is located over the upper surface of the piezoelectric substrate 12. The support substrate 10 and piezoelectric substrate 12 are cut along cutting regions overlapping the scribes 11 by a blade 26 over the protective sheet 24. The above described cutting process separates the SAW device 100R into individual chips.

However, the above fabrication method causes oblique break and chipping in the piezoelectric substrate 12. The scribe 11 is formed at the bottom surface side of the support substrate 10, and thus the support substrate 10 is hardly cut in the cutting process. This is considered to be the reason for a high incidence of chipping. For example, the oblique break and chipping can be prevented by decreasing the processing speed of the cutting process. However, the decrease in the processing speed reduces productivity, and increases the cost of the SAW device.

First Embodiment

FIG. 2A through FIG. 3B are cross-sectional views illustrating a fabrication method of a SAW device 100 in accordance with a first embodiment.

Figure 2A:
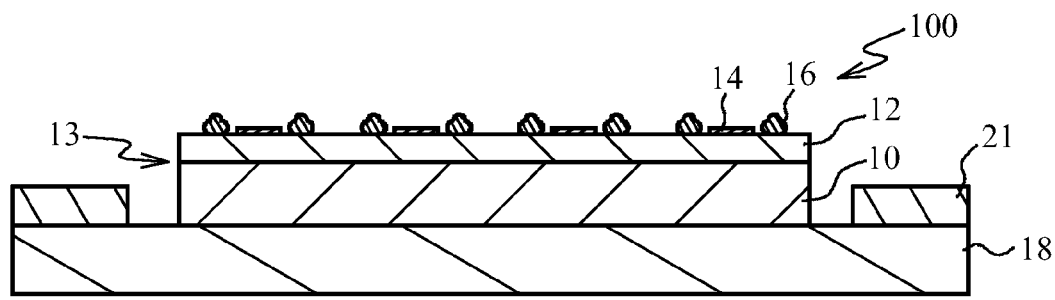
FIG. 2A through FIG. 2C are cross-sectional views illustrating a method of fabricating a SAW device in accordance with a first embodiment.
Figure 2B:
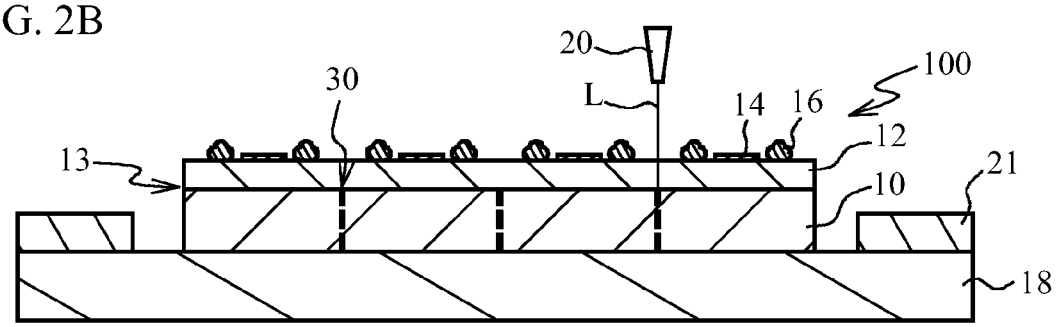

As illustrated in FIG. 2A, the dicing tape 18 is attached to the bottom surface of the support substrate 10 of the SAW device 100. The dicing tape 18 fixes the SAW device 100 to a dicing ring 21. As illustrated in FIG. 2B, the laser beam L is emitted from the upper surface side of the support substrate 10. The laser beam L penetrates the piezoelectric substrate 12, reaches the support substrate 10, and forms modified layers 30 in the support substrate 10. The modified layer 30 is formed in a region (cutting region) to be cut in the cutting process. In addition, the modified layers 30 are formed along a thickness direction.

Figure 2C:
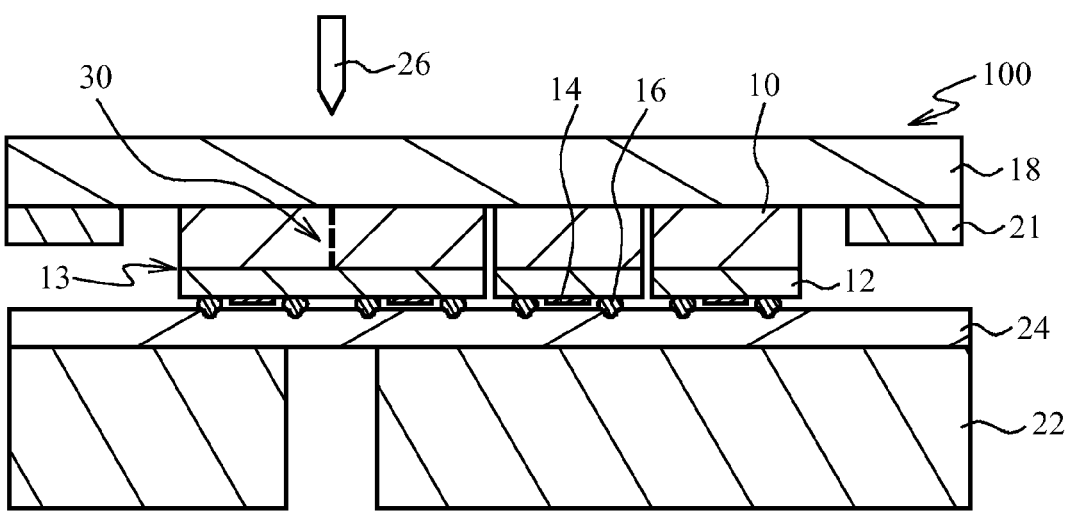
Figure 3A:
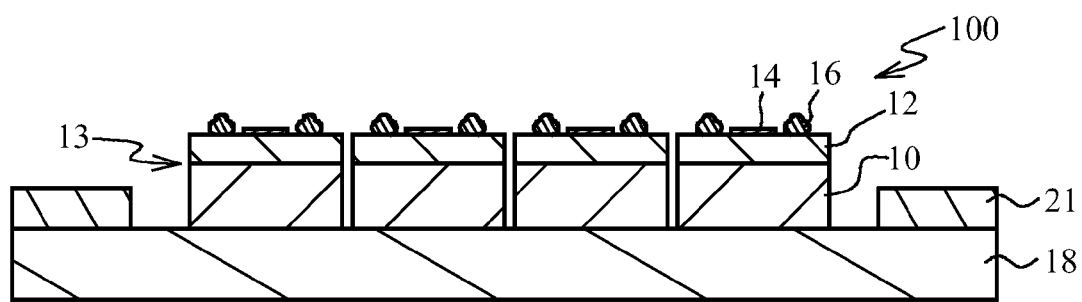
FIG. 3A and FIG. 3B are cross-sectional views illustrating a method of fabricating a SAW device.
Figure 3B:
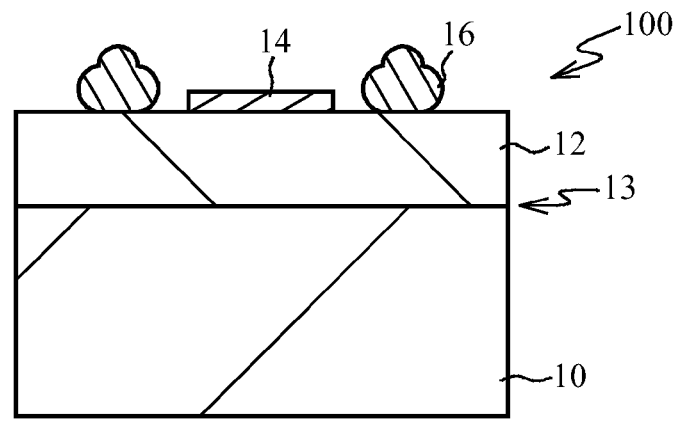

As illustrated in FIG. 2C, the protective sheet 24 is located over the upper surface of the support substrate 10. The SAW device 100 is fixed to a supporting stage 28 through the protective sheet 24. The support substrate 10 and the piezoelectric substrate 12 are cut in regions overlapping the modified layers 30 with the blade 26 over the dicing tape 18. As illustrated in FIG. 3A, the cutting process separates the SAW device 100 into individual chips. As illustrated in FIG. 3B, the SAW device 100 is removed from the dicing tape 18. The illustration is omitted, but the IDT 14 may be sealed by a resin or solder. The above described process fabricates separated SAW devices 100.

Figure 4A:
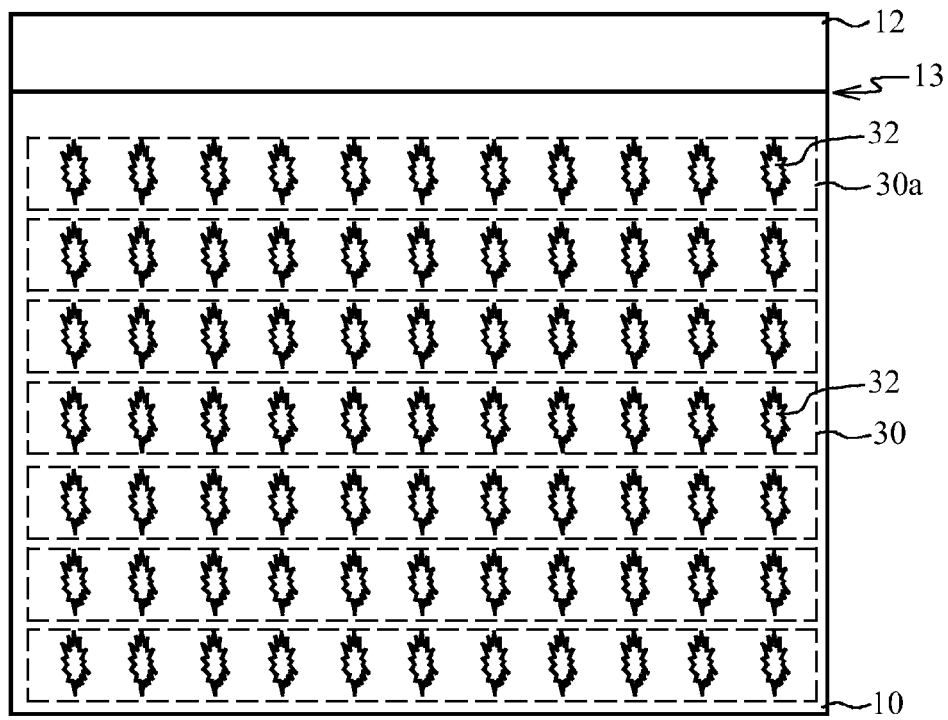
FIG. 4A is a schematic cross-sectional view illustrating a modified layer.
Figure 4B:
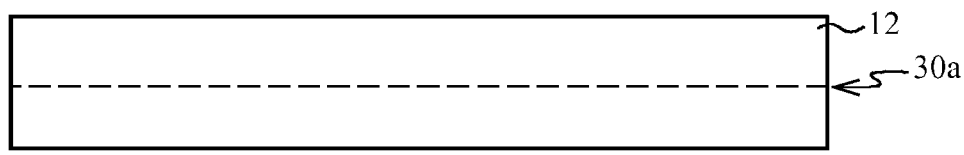
FIG. 4B is a schematic top view illustrating the modified layer.

FIG. 4A is a schematic cross-sectional view illustrating the modified layers 30. FIG. 4A illustrates a cross-section along a cutting region extending in the depth direction of FIG. 2B, and affixes reference numerals to a part of the modified layers 30 and modified regions 32. FIG. 4B is a schematic top view illustrating the modified layer 30. The IDT 14 and terminal 16 are not illustrated.

As illustrated in FIG. 4A and FIG. 4B, the modified regions 32 are formed in regions irradiated with the laser beam L. The modified region 32 is a region in which the support substrate 10 is modified by the heat of the laser beam L, and is, for example, a region formed by sapphire that is melted by the laser beam L and then reconsolidates. The multiple modified regions 32 are formed along the surface direction (horizontal direction in FIG. 4A) and the thickness direction (vertical direction). The modified regions 32 along the surface direction are located in the cutting region, and form the modified layer 30. Seven modified layers 30 are formed along the thickness direction. Distances from the boundary face 13 to the modified layers 30 are 30, 70, 110, 140, 170, 200, and 230 μm in order of increasing. The uppermost layer of the modified layers 30 is described as a modified layer 30a. The uppermost layer is a layer closest to the boundary face 13 among the modified layers 30 formed along the thickness direction.

Figure 4C:
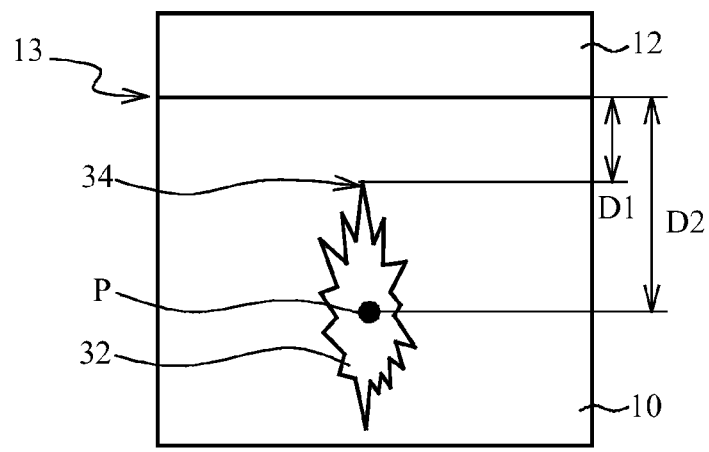
FIG. 4C is an enlarged view of the modified layer located at an uppermost layer.

FIG. 4C is an enlarged view of the modified region 32 included in the modified layer 30a. A black circle in FIG. 4C schematically represents the focal point P of the laser beam L. The modified region 32 is formed around the focal point P so as to spread from the focal point P, and widely extends in the thickness direction. The distance from the boundary face 13 to an edge portion 34 of the modified region 32 at the boundary face 13 side is expressed by D1. The distance from the focal point P to the boundary face 13 is expressed by D2. Changing the distance D2 enables to change the distance D1. The distance D2 changes in accordance with the focal distance of the laser beam L. In addition, the distance D1 varies in accordance with the power of the laser beam L. As the power of the laser beam L increases, the modified region 32 spreads wider, and the edge portion 34 comes closer to the boundary face 13. In other words, the distance D1 decreases as the power increases. Conversely, the distance D1 increases as the power decreases. A detailed description thereof will be given later.

A description will be given of an experiment that examined a relationship between the distance D1 and chipping occurrence rate (hereinafter, abbreviated as chipping rate). The distance D1 was changed to compare the chipping rates in the SAW device 100. Prepared were 13720 samples for each identical distance D1, and the modified layer 30 was formed and cut therein. The chipping rate is a ratio of the number of samples in which chipping occurred to 13720 samples. The support substrate 10 is formed of sapphire with a thickness of 250 μm. The piezoelectric substrate 12 is formed of $LiTaO_3$ with a thickness of 30 μm. The modified layers 30 are formed along the thickness direction as described in FIG. 4A.

Figure 5:
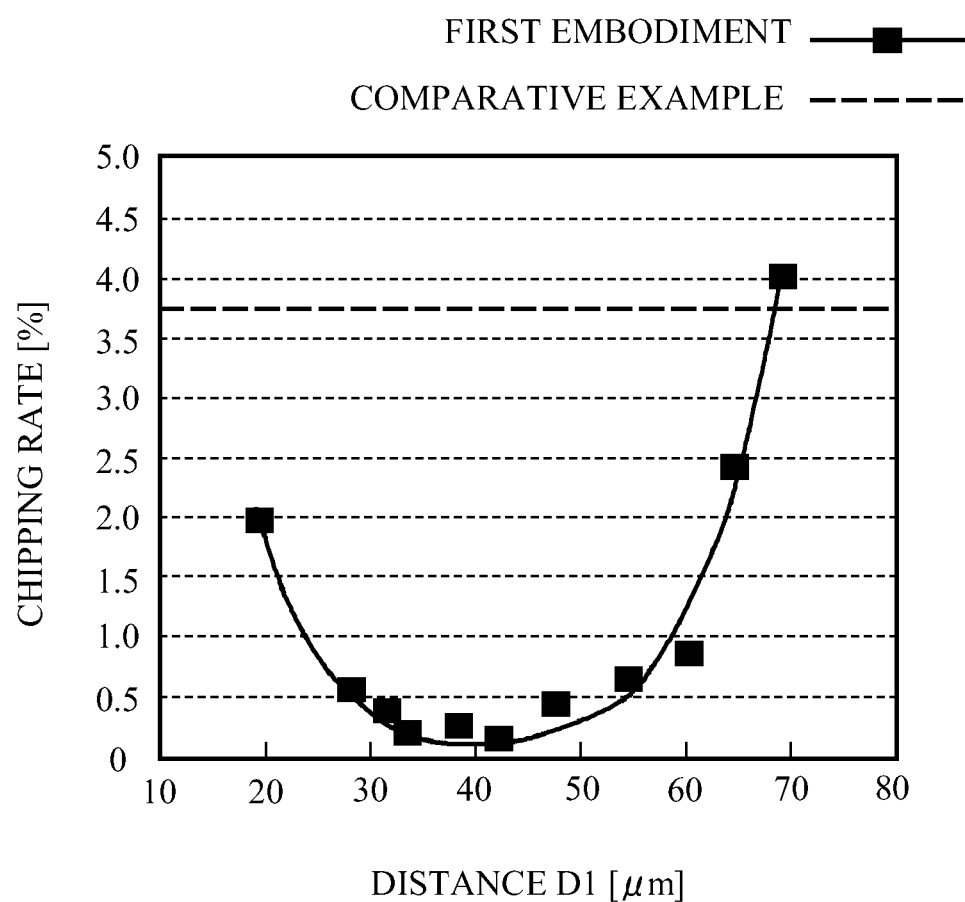
FIG. 5 is a graph illustrating a relationship between distance and chipping occurrence rate.

FIG. 5 is a graph illustrating a relationship between the distance D1 and the chipping rate. The dashed line in the drawing indicates 3.7% that is the chipping rate in the comparative example. Table 1 is a table presenting a relationship among the distance D1, the number of samples in which chipping occurred (chipping number), and the chipping rate.

TABLE 1

| DISTANCE D1 [μm] | CHIPPING NUMBER [sample] | CHIPPING RATE [%] |
|---|---|---|
| 19.5 | 271 | 1.98 |
| 28.3 | 78 | 0.57 |
| 31.8 | 50 | 0.36 |
| 33.7 | 29 | 0.21 |
| 38.3 | 36 | 0.26 |
| 42.3 | 21 | 0.15 |
| 47.5 | 60 | 0.44 |
| 54.5 | 90 | 0.66 |
| 60.3 | 119 | 0.87 |
| 64.5 | 332 | 2.42 |
| 69.1 | 551 | 4.02 |

As presented in FIG. 5 and Table 1, when the distance D1 is 19.5 μm, the chipping rate is 1.98%. When the distance D1 is 28.3 μm, the chipping rate greatly decreases and is 0.57%. When the distance D1 is 69.1 μm, the chipping rate is 4.02%, and higher than that of the comparative example. When the distance D1 is 64.5 μm, the chipping rate is reduced to 2.42%, and when the distance D1 is 60.3 μm, the chipping rate is reduced to 0.87%. It is considered that the SAW device 100 becomes brittle and thus chipping increasingly occurs when the distance D1 is small such as 19.5 μm. In addition, it is considered that the support substrate 10 is difficult to be cut in the cutting process and thus chipping occurs frequently when the distance D1 is large such as 69.1 μm. Chipping occurs frequently at especially the boundary face 13.

In contrast, when the distance D1 is greater than or equal to 20 μm and less than 69 μm, the chipping rate decreases, and is lower than that of the comparative example. In addition, the oblique break can be also prevented in addition to the chipping. As described above, the distance D1 greater than or equal to 20 μm enhances the strength of the support substrate 10 and the piezoelectric substrate 12. In addition, the distance D1 less than 69 μm allows the support substrate 10 to be easily cut. Moreover, the productivity increases because the processing speed of the cutting process does not need to be decreased. For example, the processing speed of the cutting process in the first embodiment is approximately 6 times faster than that of the comparative example. Therefore, the cost of the SAW device 100 can be reduced.

When the distance D1 is greater than or equal to 28 μm and less than 65 μm, the chipping rate is greatly reduced to less than or equal to 2.5%. When the distance D1 is configured to be less than 60 μm, the chipping rate becomes less than or equal to 1%. When the distance D1 is configured to be greater than or equal to 30 μm and less than 50 μm, the chipping rate is further reduced to less than or equal to 0.5%. The distance D1 may be greater than 20 μm, 28 μm, or 30 μm for example, and may be less than or equal to 50 μm, 60 μm, 65 μm, or 69 μm.

Figure 6A:
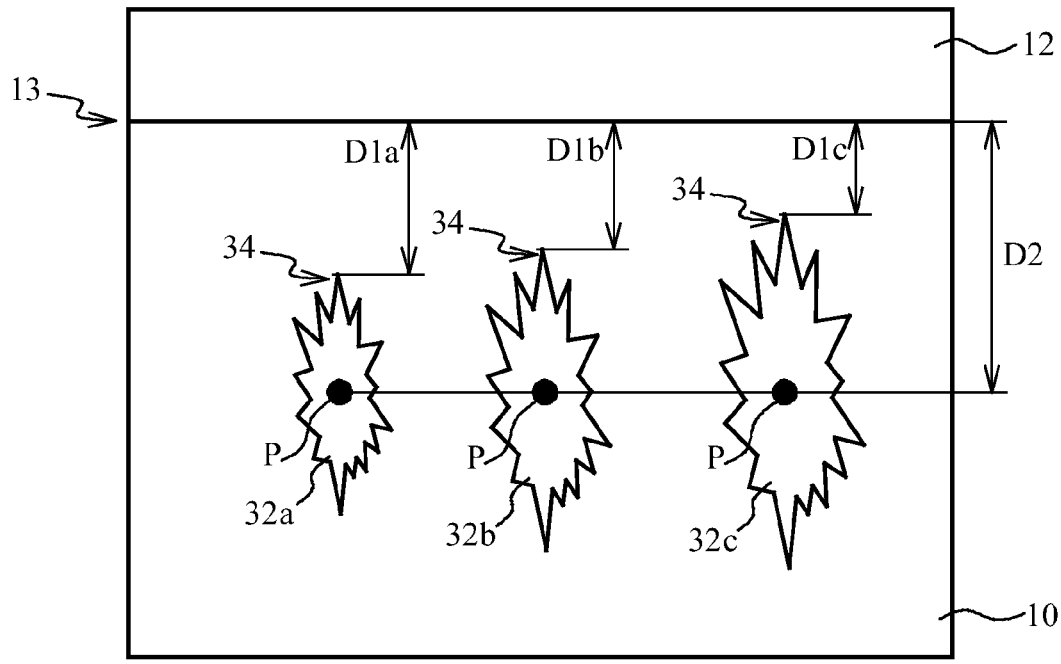
FIG. 6A and FIG. 6B are schematic cross-sectional views illustrating modified layers when the output of a laser beam was changed.
Figure 6B:
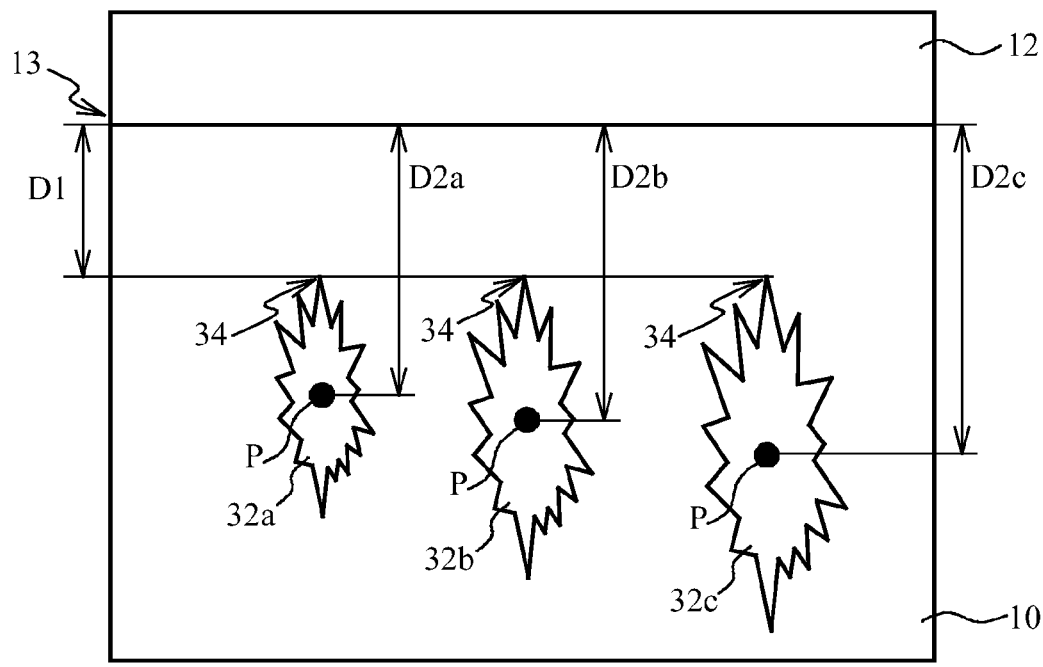

The distance D1 varies in accordance with the power of the laser beam L. A description will be given of an example that changed the power of the laser beam L to 0.1 W, 0.15 W, and 0.2 W. FIG. 6A and FIG. 6B are schematic cross-sectional views illustrating the modified region 32 when the power of the laser beam L was changed. The power means the output of the laser beam L emitted from the laser irradiation device 20. The frequency of the laser beam L is constant.

In a case illustrated in FIG. 6A, the focal points P of the laser beam L are positioned at the same distance D2 from the boundary face 13. A modified region 32a was formed by the laser beam L with a power of 0.1 W. A modified region 32b was formed by the laser beam L with a power of 0.15 W, and had a size approximately 1.2 times larger than that of the modified region 32a. A modified region 32c was formed by the laser beam L with a power of 0.2 W, and had a size approximately 1.5 times larger than that of the modified region 32a. As described above, the modified region 32 becomes smaller as the power becomes lower, while the modified region 32 becomes larger as the power becomes higher. The distance from the edge portion 34 of the modified region 32a to the boundary face 13 is expressed by D1a, the distance from the edge portion 34 of the modified region 32b to the boundary face 13 is expressed by D1b, and the distance from the edge portion 34 to the modified region 32c and the boundary face 13 is expressed by D1c. The distance D1c is less than the distance D1b, and the distance D1b is less than the distance D1a. As described above, the power of the laser beam L changes the distance from the boundary face 13 to the edge portion 34, and thus it is difficult to configure the distance to be in the appropriate range presented in FIG. 5 and Table 1. Therefore, it becomes difficult to prevent the chipping and oblique break.

The example illustrated in FIG. 6B changes the position of the focal point P in accordance with the power. When the power is 0.1 W, the distance from the boundary face 13 to the focal point P is D2a. When the power is 0.15 W, the distance from the boundary face 13 to the focal point P is D2b and greater than the distance D2a. When the power is 0.2 W, the distance from the boundary face 13 to the focal point P is D2c and greater than the distance D2b. As described above, as the power of the laser beam L is higher, a position farther from the boundary face 13 is irradiated with the laser beam L, and the focal point P is formed at the position farther from the boundary face 13. This allows the distance D1 to be almost constant even when the power of the laser beam L is changed. Therefore, the distance D1 can be configured to be appropriate. The chipping and oblique break can be effectively prevented even when the power of the laser beam L is changed in accordance with the thickness of the piezoelectric substrate 12 for example. The distance D1 does not have to be constant as long as it is within the range described in FIG. 5 and Table 1.

Figure 7A:
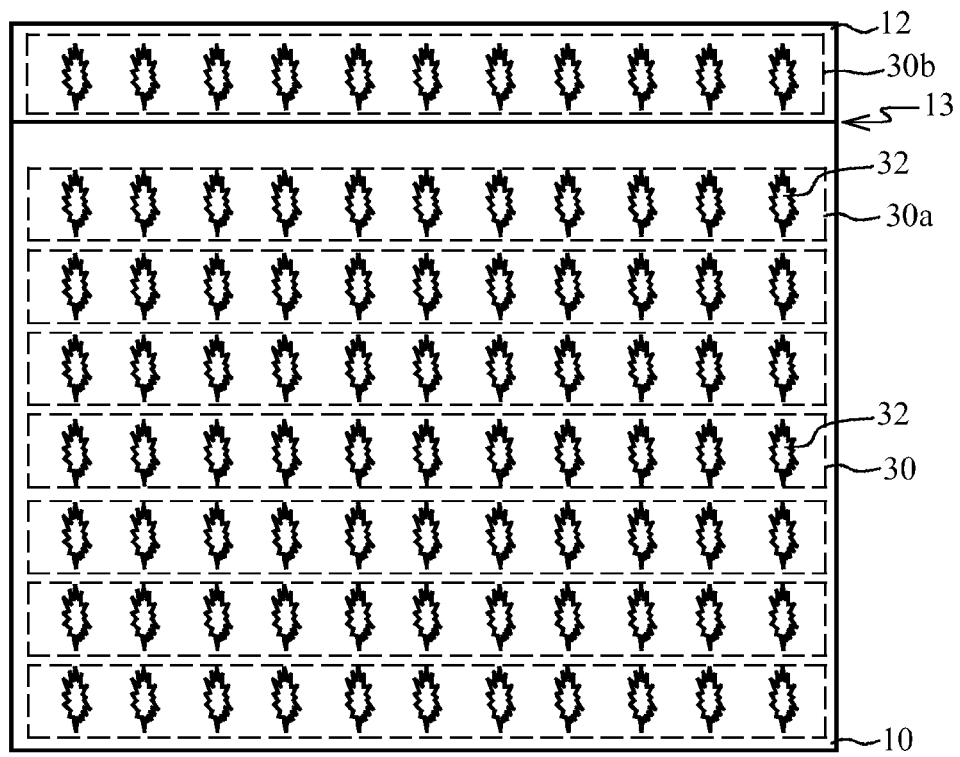
FIG. 7A is a schematic cross-sectional view illustrating an example that forms a modified layer in a piezoelectric substrate.
Figure 7B:
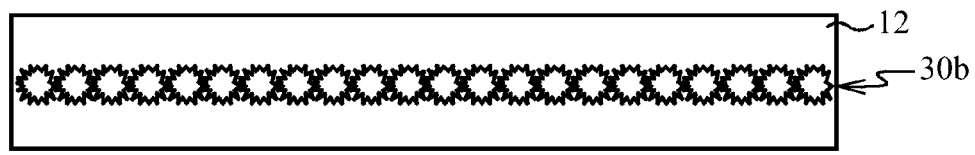
FIG. 7B is a schematic top view.

In addition, the modified layer 30 can be also formed in the piezoelectric substrate 12 by changing the focal distance of the laser beam L. FIG. 7A is a schematic cross-sectional view illustrating a case where a modified layer 30b is formed in the piezoelectric substrate 12. FIG. 7B is a schematic top view.

As illustrated in FIG. 7A and FIG. 7B, the modified layer 30b is formed in the piezoelectric substrate 12. When the modified layer 30b is formed in the piezoelectric substrate 12, the SAW device 100 becomes brittle. This causes the chipping and oblique break frequently. Therefore, the modified layer 30 is preferably formed only in the support substrate 10 out of the support substrate 10 and the piezoelectric substrate 12. In addition, even when the support substrate 10 is irradiated with the laser beam L, the edge portion 34 preferably fails to reach the boundary face 13.

The distance D1 from the edge portion 34 of the modified region 32 closest to the boundary face 13 among the modified regions 32 formed along the surface direction to the boundary face 13 has only to be within the range described in FIG. 5 and Table 1. The number of modified layers 30 and modified regions 32 can be arbitrarily selected. Multiple modified layers 30 may be formed along the thickness direction, or the modified layer 30 may be a single layer. When the support substrate 10 is thick, the support substrate 10 becomes easily cut in the cutting process by forming the modified layers 30 along the thickness direction as illustrated in FIG. 4A. Thus, the chipping and oblique break can be prevented, and the processing speed of the cutting process can be increased. For example, the cutting process is easily executed by forming the modified layers 30 at even intervals in the thickness direction. As illustrated in FIG. 4A and FIG. 4B, the modified regions 32 formed in the surface direction may form the modified layer 30, or the single modified region 32 may form the modified layer 30. It is sufficient if the support substrate 10 and piezoelectric substrate 12 are cut in the modified region 32.

The support substrate 10 preferably includes a material having a linear expansion coefficient less than that of the piezoelectric substrate 12 such as sapphire, and may be formed of silicon for example. This cancels out change in the electromechanical coupling factor of the piezoelectric substrate 12 due to temperature, and thus stabilizes characteristics of the SAW device 100. The piezoelectric substrate 12 may be formed of other piezoelectric substances such as lithium niobate ($LiNbO_3$). The first embodiment can be applied to boundary acoustic wave devices in addition to the SAW device. The support substrate 10 and the piezoelectric substrate 12 may be cut from any of the bottom surface side and upper surface side of the support substrate 10 in the cutting process. The IDT 14 and terminal 16 may be formed on the piezoelectric substrate 12 after or before the support substrate 10 is bonded to the piezoelectric substrate 12.

Although the embodiments of the present invention have been described in detail, it is to be understood that the various change, substitutions, and alterations could be made hereto without departing from the spirit and scope of the invention.

What is claimed is:

1. A method of fabricating an acoustic wave device, the method comprising:
    bonding an upper surface of a support substrate formed of sapphire to a lower surface of a piezoelectric substrate formed of lithium tantalate, said piezoelectric substrate having an upper surface on which an IDT is to be formed;
    forming a plurality of modified regions in the support substrate that are aligned along a thickness direction of the support substrate by irradiation of a laser beam, the plurality of modified regions not being formed in the piezoelectric substrate; and
    cutting the support substrate and the piezoelectric substrate vertically at a location of the plurality of modified regions, wherein
    a shortest distance from a boundary plane between the upper surface of the support substrate and the lower surface of the piezoelectric substrate to an edge of a closest one of the plurality of modified regions to said boundary plane is greater than or equal to 20 μm and less than 69 μm.

2. The method according to claim 1, wherein
    said shortest distance from the boundary plane to the edge of the closest modified region is greater than or equal to 28 μm and less than 60 μm.

* * * * *